United States Patent
Auracher et al.

(10) Patent No.: US 6,567,439 B1
(45) Date of Patent: May 20, 2003

(54) RADIO-FREQUENCY LASER MODULE AND A METHOD FOR PRODUCING IT

(75) Inventors: Franz Auracher, Baierbrunn (DE); Hans-Ludwig Althaus, Lappersdorf (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/320,046

(22) Filed: May 26, 1999

(30) Foreign Application Priority Data

May 26, 1998  (DE) ......................... 198 23 479

(51) Int. Cl.[7] .............. H01S 5/00; H01S 3/04
(52) U.S. Cl. .......................... 372/36; 372/43
(58) Field of Search .............. 372/36, 43, 50

(56) References Cited

U.S. PATENT DOCUMENTS

| | | | |
|---|---|---|---|
| 4,989,930 A | * 2/1991 | Nakagawa et al. | 385/35 |
| 5,566,265 A | 10/1996 | Spaeth et al. | 385/93 |
| 5,602,672 A | 2/1997 | Ishimura et al. | 359/245 |
| 5,781,578 A | * 7/1998 | Takagi | 372/50 |

FOREIGN PATENT DOCUMENTS

| | | |
|---|---|---|
| DE | 39 02 579 A1 | 8/1989 |
| DE | 197 00 261 A1 | 2/1998 |
| EP | 0 660 467 A1 | 6/1995 |

OTHER PUBLICATIONS

Japanese Patent Abstract No. 02271585 (Tatsuo), dated Nov. 6, 1990.
Japanese Patent Abstract No. 04373155 (Hideho), dated Dec. 25, 1992.
Japanese Patent Abstract No. 05110201 (Keisaku), dated Apr. 30, 1993.
Japanese Patent Abstract No. 06125136 (Takeyuki), dated May 6, 1994.
Japanese Patent Abstract No. 09252164 (Shinichi), dated Sep. 22, 1997.
International Patent Application WO 87/02834 (Dietrich et al.), dated May 7, 1987.
International Patent Application WO 92/13369 (Lawson), dated Aug. 6, 1992.

* cited by examiner

Primary Examiner—Quyen Leung
(74) Attorney, Agent, or Firm—Laurence A. Greenberg; Werner H. Stemer; Ralph E. Locher

(57) ABSTRACT

A radio-frequency laser module has a substrate and a semiconductor laser disposed on the substrate. An electrical RF conductive path is provided on the substrate, to a first end of which path an external RF driver signal can be applied and which is electrically connected at a second end to an RF connection of the semiconductor laser. The RF conductive path contains a series-connected RF matching resistor, $R_A$.

14 Claims, 7 Drawing Sheets

RADIO-FREQUENCY LASER MODULE AND A METHOD FOR PRODUCING IT

BACKGROUND OF THE INVENTION

1. Field of the Invention

The invention relates to radio-frequency laser module having a semiconductor laser disposed on a substrate and an electrical RF conductive path disposed on the substrate and connected to the laser. The invention also relates to an optoelectronic component which has such a radio-frequency laser module accommodated in a case, as well as to a method for producing a large number of radio-frequency laser modules on a semiconductor wafer.

Laser modules as well as optoelectronic components based on such laser modules are already known and have been described, for example, in Published, European Patent Application EP 0 660 467 A1 and U.S. Pat. No. 5,566,265. Furthermore, the Published, European Patent Application EP 0 660 467 A1 discloses a method by which a large number of optoelectronic laser modules can be produced on a common silicon wafer.

Such optoelectronic components are widely used in particular in data transmission and information technology. In order to allow as much information as possible to be transmitted per unit time, the components are normally operated in the radio-frequency band. The maximum achievable data rate for the component is in this case not only governed by the semiconductor laser used, but depends on a large number of other electrical, optical and constructional measures for the entire optoelectronic component, including the case used.

2. Summary of the Invention

It is accordingly an object of the invention to provide a radio-frequency laser module and a method for producing it, which overcomes the above-mentioned disadvantages of the prior art devices and methods of this general type.

The invention is partially based on the object of providing a radio-frequency laser module with good RF characteristics. A further part of the object on which the invention is based is to provide an optoelectronic component having a case which accommodates the radio-frequency laser module according to the invention and which is specifically configured for radio-frequency applications. Furthermore, the invention has the aim of specifying a particularly economic and cost-effective method for producing such radio-frequency laser modules on a semiconductor wafer.

With the foregoing and other objects in view there is provided, in accordance with the invention, a radio-frequency laser module, including:
  a substrate;
  a semiconductor laser having an RF connection and disposed on the substrate; and
  an electrical RF conductive path having a first end and a second end and disposed on the substrate, the first end to receive an external RF driver signal and the second end is electrically connected to the RF connection of the semiconductor laser, the electrical RF conductive path also has an RF matching resistor $R_A$ connected in series with the semiconductor laser.

Integration of the RF matching resistor $R_A$ into the RF conductive path disposed on the substrate (laser submount) results in the RF matching resistor $R_A$ being positioned in the immediate vicinity of the semiconductor laser. This ensures particularly effective and interference-free matching of the normally low-impedance semiconductor laser (typically 3 to 5 ohms) to the impedance of a driver circuit (normally 25 or 30 ohms), as a result of which the radio-frequency characteristics of the laser module are considerably improved.

If, furthermore, an electrical secondary conductive path is provided on the substrate and is connected to the RF connection of the semiconductor laser bypassing the RF matching resistor, this results in an interconnect structure which is applied on the substrate and is particularly advantageous for producing a large number of radio-frequency laser modules in a composite wafer.

The light produced by the semiconductor laser can pass through an electrical absorption modulator (EAM) in a manner known per se, and be RF-modulated by the modulator. In this case, the EAM is likewise disposed on the substrate, and in that an RF connecting pad (provided on the substrate) and a ground contact pad (provided on the substrate) on the EAM are connected via an RF conductive path which runs on the substrate and contains an RF matching resistor $R_A$. Since the EAM is operated in the reverse direction, that is to say essentially represents a small capacitance, matching is carried out by using a matching resistor connected in parallel with the EAM. The joint configuration of the semiconductor laser and EAM on the same substrate results in a particularly compact overall configuration that is advantageous for RF applications and which, furthermore, can be manufactured easily. Since the RF matching resistor is formed within an RF conductive path which runs on the substrate, it is located in the immediate vicinity of the EAM, thus having an advantageous influence on the RF characteristics of the EAM.

If the RF laser module according to the invention is installed, attention must be paid to good RF configuring of the assembly. The features specified in the claims result in contact being made with the RF laser module inside the case in a manner that is advantageous for achieving high data rates.

RF laser modules with a bandwidth of more than 5 GHz can be achieved by RF blocking of the bias-current connection of the RF semiconductor laser by a suitable inductor (for example a coil with a ferrite core). Even with uncooled optoelectronic components, this allows data rates of at least 3 Gbit/s to be achieved.

An optical isolator provided in the beam path of the RF laser module can improve the RF characteristics of the laser module by largely suppressing the return of reflected laser light to the laser and, in this way, considerably reducing any interference feedback effects.

According to the invention, a large number of RF laser modules are produced on a joint semiconductor wafer, in particular a silicon wafer. This has, inter alia, the advantage that simple production and assembly sequences are possible owing to the good handling characteristics of the semiconductor wafer. At the same time, the interconnect pattern provided according to the invention on the semiconductor wafer allows a functional and long-term test of the RF laser modules (which is already known as such and is called "burn-in") to be carried out while they are still within the composite wafer. During the "burn-in" process, the laser chip has a relatively high current applied to it for a predetermined time period, which may be 48 hours or more, during which the stability of major functional parameters is tested, and a characterization of the laser chip is determined. In the case of the RF laser modules according to the invention and having matching resistors $R_A$ disposed directly on the substrate, this "burn-in" procedure would, however, lead to thermal overloading of the matching resistors $R_A$. The interconnect pattern according to the invention with a secondary conductive path ensures that the current flowing during the "burn-in" procedure does not flow through the RF matching resistors $R_A$, but bypasses them via the secondary conductive paths. This allows the "burn-in" procedure to be carried out in an economic manner in the composite wafer during production of the laser modules, that is to say before the semiconductor wafer is cut up into the individual laser modules.

Other features which are considered as characteristic for the invention are set forth in the appended claims.

Although the invention is illustrated and described herein as embodied in a radio-frequency laser module and a method for producing it, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1b is a perspective view of the laser module illustrated in FIG. 1a;

FIG. 2b is a plan view of the RF laser module illustrated in FIG. 2a;

DESCRIPTION OF THE PREFERRED EMBODIMENTS

Figure 1A:
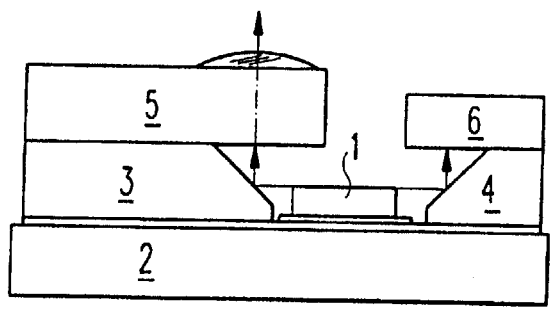
FIG. 1a is a diagrammatic, cross-sectional view of a laser module according to the prior art.

In all the figures of the drawing, sub-features and integral parts that correspond to one another bear the same reference symbol in each case. Referring now to the figures of the drawings in detail and first, particularly, to FIG. 1a thereof, there is shown a known laser module that has, as a light transmitter, a laser chip 1 which is disposed on a substrate 2 that is preferably composed of silicon. The substrate 2, which is also called a silicon submount, is furthermore fitted with two deflection prisms 3, 4 which are disposed on both sides of the laser chip 1 and have mirror surfaces, which are oriented at an angle of 45° with respect to an active surface of the laser chip 1. A coupling lens 5 is fitted on the one deflection prism 3 and is disposed such that laser radiation produced in the laser chip 1 and deflected by the deflection prism 3 passes through the coupling lens 5, essentially in the direction of its optical axis. In this case, a monitor chip 6 may also be mounted, without the deflection prism 4, directly on the substrate (silicon submount, 2).

The monitor chip 6 is disposed and mounted on the second deflection prism 4 in such a manner that it receives a portion of the optical radiation produced by the laser chip 1. The monitor chip 6 can be used for measuring or controlling laser power.

Figure 1B:
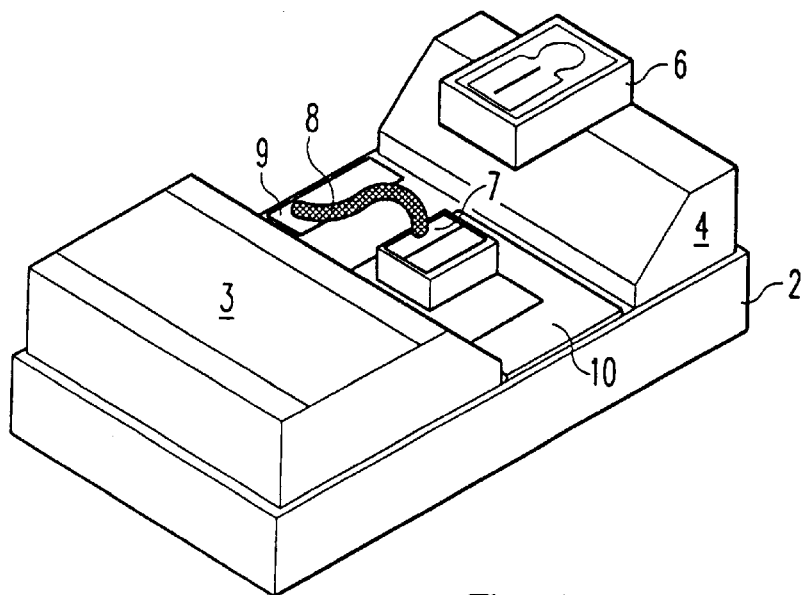

FIG. 1b shows a perspective view of the laser module illustrated in FIG. 1a. For reasons of clarity, the coupling lens 5 is omitted in FIG. 1b. A contact 7 at a top of the laser chip 1 is connected via a bonding wire 8 to a contact pad 9 which is applied at an edge on the substrate 2, while the contact at a bottom of the laser chip 1 (which cannot be seen in FIG. 1b) is positioned, such that it makes electrical contact, on an interconnect strip 10, which is connected to the opposite edge of the substrate 2 and has a contact-making surface there.

Figure 2A:
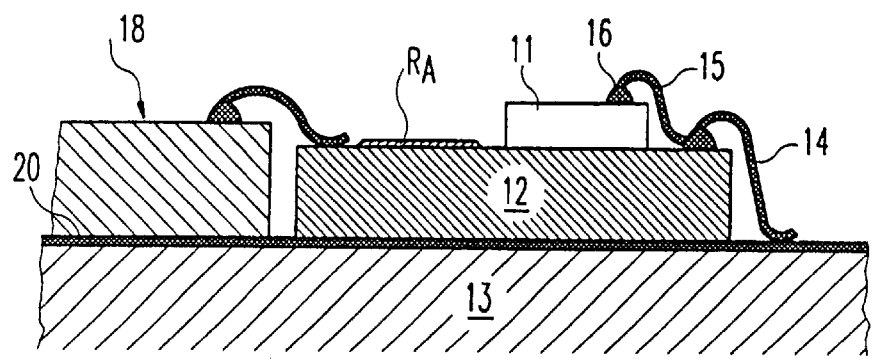
FIG. 2a is a sectional view of an RF laser module according to the invention.
Figure 2B:
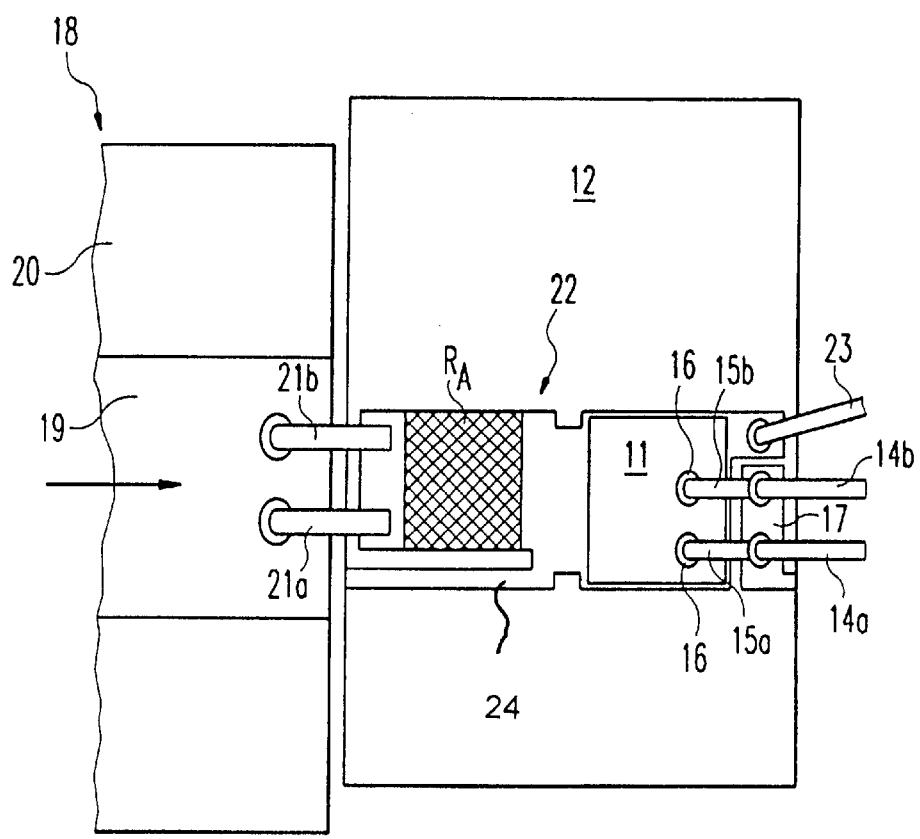

FIGS. 2a and 2b illustrate an exemplary embodiment of the RF laser module according to the invention for high data rates. Once again, a laser chip 11 is disposed above a semiconductor substrate 12, which is preferably composed of silicon. The substrate 12 is positioned on a case base plate 13 which is at ground potential, and is connected via two series-connected bonding lines 14 and 15 to the (generally p−) contact 16 of the laser chip 11 located at the top.

FIG. 2b clearly shows that both the first bonding line 14 and the second bonding line 15 can each be formed from two (or else more) single bonding wires 14a, 14b and 15a, 15b, respectively, which are jointly bonded to a ground contact pad 17 disposed on the substrate 12.

The RF data signal is passed via a suitable radio-frequency-compatible supply line into the region of the substrate 12. In the illustrated example, a stripline 18 is used as the data supply line and essentially contains a metal strip 19 which carries the data signal, runs above a ground conductor 20, and is routed such that it is insulated from the ground conductor 20. The ground conductor 20 forms a lower side of the stripline 18 and is electrically conductively connected to a ground surface on the case base plate 13, to which the bonding wires 14a, 14b are also fitted. The metal strip 19 is connected via two or (in a manner which is not illustrated) more RF bonding wires 21a, 21b to the one end of an RF conductive path 22 which is provided on the substrate 12 and is electrically connected at its other end to a contact at the bottom of the laser chip 11. According to the invention, a matching resistor $R_A$ is integrated in the RF conductive path 22 and is used to match the low-impedance laser chip 11 as well as possible to the characteristic impedance of the stripline 18 and, in the present example, has a value of 22 W.

Instead of the stripline 18 illustrated in FIGS. 2a and 2b, a coaxial line or a coplanar line with RF conductor and ground strips disposed alongside one another may also be used as the RF supply line. The matching resistor $R_A$ can preferably be selected as a function of the RF supply line type used, and its dimensions.

A bias current is supplied to the laser chip 11 via the supply line 23.

The RF connection at the bottom of the laser chip 11 is furthermore connected to a secondary conductive path 24 which runs on the substrate 12, allows the matching resistor $R_A$ to be bypassed, and is particularly important for the production process (which will be explained further below) for the radio-frequency laser module in the composite wafer.

Figure 3A:
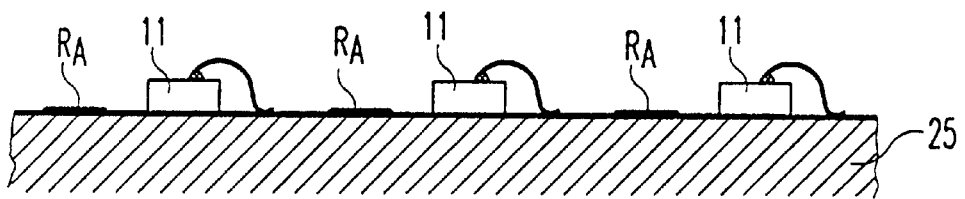
FIG. 3a is a sectional view of two adjacent interconnect structures in order to explain an interconnect pattern applied on a silicon wafer.
Figure 3B:
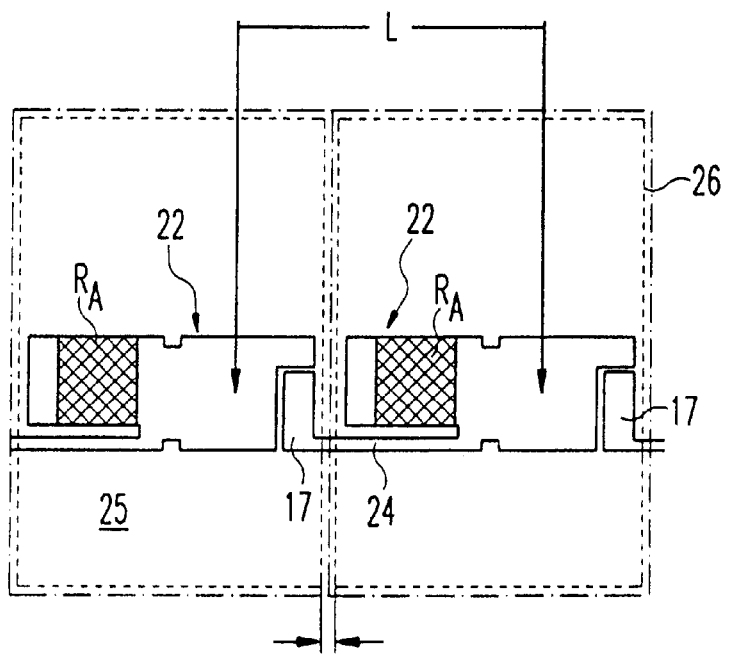
FIG. 3b is a plan view of the silicon wafer with RF laser modules disposed on it.

In order to produce the RF laser modules according to the invention, an interconnect pattern is first of all applied by known techniques onto a silicon wafer 25, as is illustrated in FIG. 3b, which interconnect pattern is formed from periodically repeating interconnect structures. Two adjacent structures are illustrated in FIGS. 3a and 3b. The dashed lines 26 in this case indicate the contours of the subsequent substrate 12 (silicon submount). The essential feature is that, with adjacent structures, an electrical connection exists between the ground contact pad 17 of the one structure and the secondary conductive path 24 of the other structure.

In the following text, the laser chips 11 are mounted by soldering or some other conventional process onto regions L of the individual interconnect structures provided for this purpose. The fitting process can to a large extent be automated, and can thus be carried out in a very economic manner.

Deflection prisms are then grouped around the laser chip 11, in a manner which is not illustrated, and are mounted on the silicon wafer 25, and this can be done, for example, by a further soldering process. The configuration of the deflection prisms may be selected in accordance with the illustrations in FIGS. 1a, 1b, 2a and 2b.

It is also possible to apply the deflection prisms, in the form of continuous prism strips, before the laser chips 11 are fitted to the silicon wafer 25. The prism strips are then broken up into individual deflection prisms, along the separating lines 26, during the subsequent process of separating the substrates 12.

In a further step of the production method, the laser chips 11 mounted on the silicon wafer 25 are subjected to a joint functional test or pre-aging ("burn-in"). The test must be carried out in high-current conditions in order to provide life protection for the individual laser chips 11 in a reasonable time. In this case, the "burn-in" current bypasses the matching resistors $R_A$ via the secondary conductive paths 24 owing to the configuration of the interconnect pattern according to the invention, so that no current flows through the matching resistors $R_A$ and no heating of the resistors whatsoever can occur, let alone overheating. The situation makes it possible to carry out a functional test of the individual laser chips 11 with the RF matching resistors $R_A$ in the composite wafer.

After the functional test, the wafer can be cut up into the individual submounts in the normal manner, along the separating lines 26. The submounts can then be processed further individually and, in this case, can be provided, for example, with lens coupling optics as shown in FIGS. 1a, 1b, 2a and 2b. Furthermore, they can be equipped with other optical components (for example an optical isolator) that are particularly suitable for RF applications. However, it is also possible to carry out the further processing steps even before the separation of the submounts, that is to say on the intact silicon wafer 25.

Figure 4:
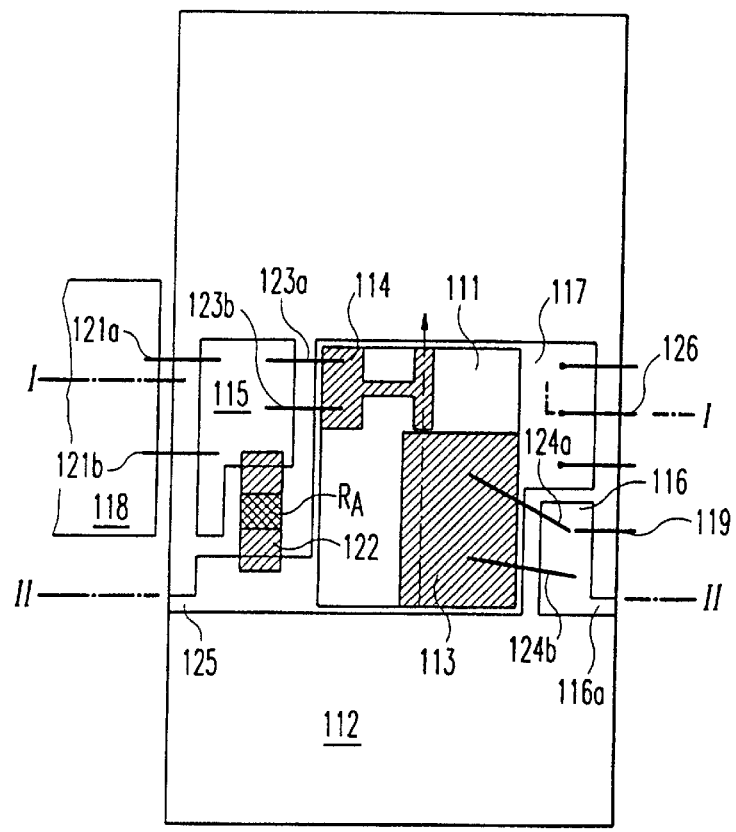
FIG. 4 is a plan view of a laser chip disposed on a substrate, with a semiconductor laser and an integrated electrical absorption modulator.

FIG. 4 shows a laser chip 111 that has been applied to a substrate 112 and contains a semiconductor laser 113 as well as an integrated EAM 114. An RF data signal is passed via a stripline 118 and bonding wires 121a, 121b to an RF connecting pad 115 disposed on the substrate 112. The RF connecting pad 115 is electrically connected to an RF input of the EAM 114 via further bondings 123a, 123b.

The laser chip 111 is mounted on a ground contact pad 117, which forms a joint ground contact for the semiconductor laser 113 and the EAM 114. Furthermore, a bonding pad 116 is provided on the substrate 112, and is connected via bonding lines 124a, 124b to an input connection at the top of the semiconductor laser 113. The semiconductor laser 113 is supplied with a direct current, that is to say is operated in the continuous-wave mode, via a supply line 119 which makes electrical contact with the bonding pad 116.

One essential feature for the invention is that the RF connecting pad 115 is connected to the ground contact pad 117 via an RF matching resistor $R_A$. The latter is formed in an RF conductive path 122, which runs on the substrate 112 between the RF connecting pad 115 and the ground contact pad 117, and typically has a value of about 50 ohms. The RF matching resistor $R_A$ is connected in parallel with the EAM 114, which is operated in the reverse direction. Owing to its configuration according to the invention on the substrate 112, it is positioned in the immediate vicinity of the EAM 114, thus having an advantageous influence on the radio-frequency characteristics of the module.

Furthermore, the ground contact pad 117 is connected to one edge of the substrate 112 by a contact spur 125. Before the substrates 112 (submounts) are separated, the contact spur 125 forms an electrical connection to an attachment 116a on the bonding pad 116 of an adjacent interconnect structure, and thus allows the "burn-in" in the composite wafer.

Figure 5A:
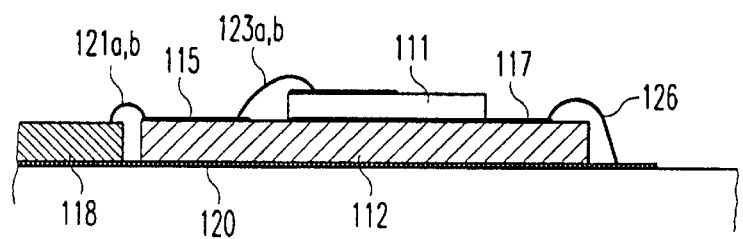
FIG. 5a is a sectional view taken along the line I—I in FIG. 4.

FIG. 5a shows a section through the substrate 112, with the laser chip 111, along the line I—I. A ground conductor 120, which forms the underneath of the microstrip conductor 118, is continued underneath the substrate 112 and makes contact with the ground pad 117 via ground bonding lines 126. The corresponding view with a section along the line II is illustrated in FIG. 5b.

Figure 5B:
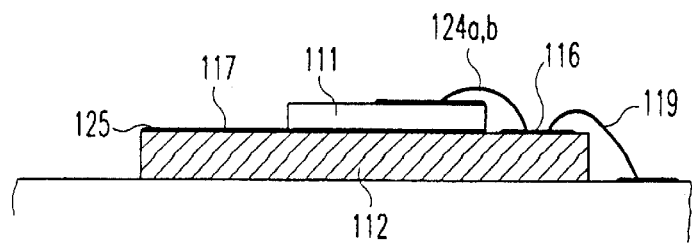
FIG. 5b is a sectional view taken along the line II—II in FIG. 4.
Figure 6:
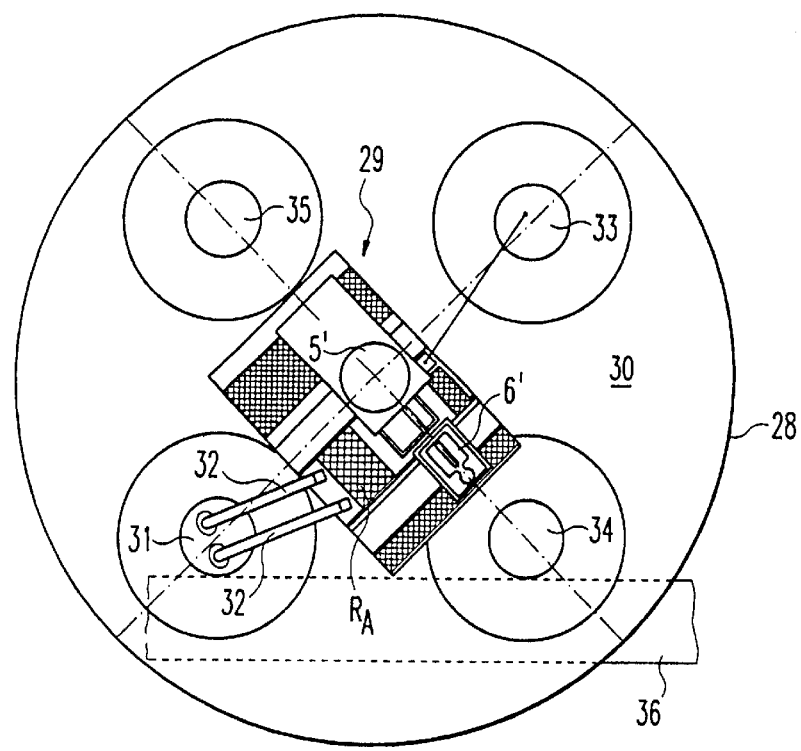
FIG. 6 is a plan view of a first exemplary embodiment of an optoelectronic component having the RF laser module mounted on a case base of a component.
Figure 7:
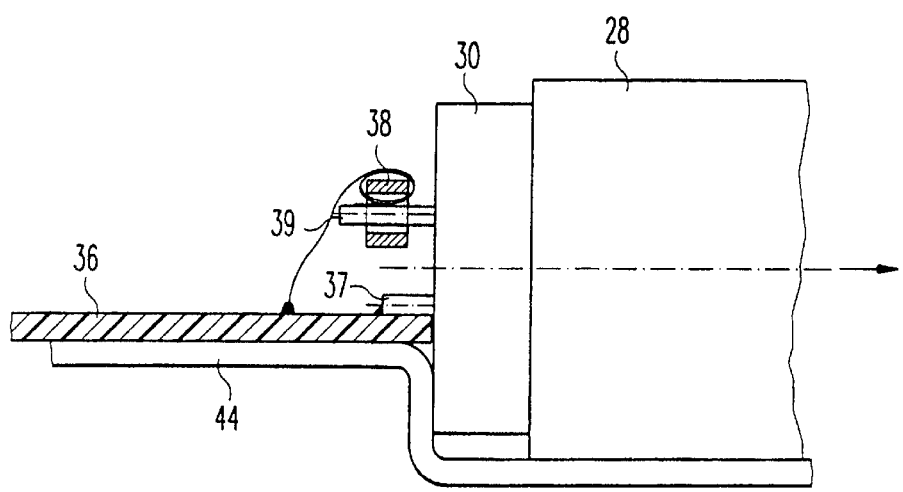
FIG. 7 a fragmentary, partial sectional view of the component from FIG. 6.
Figure 8:
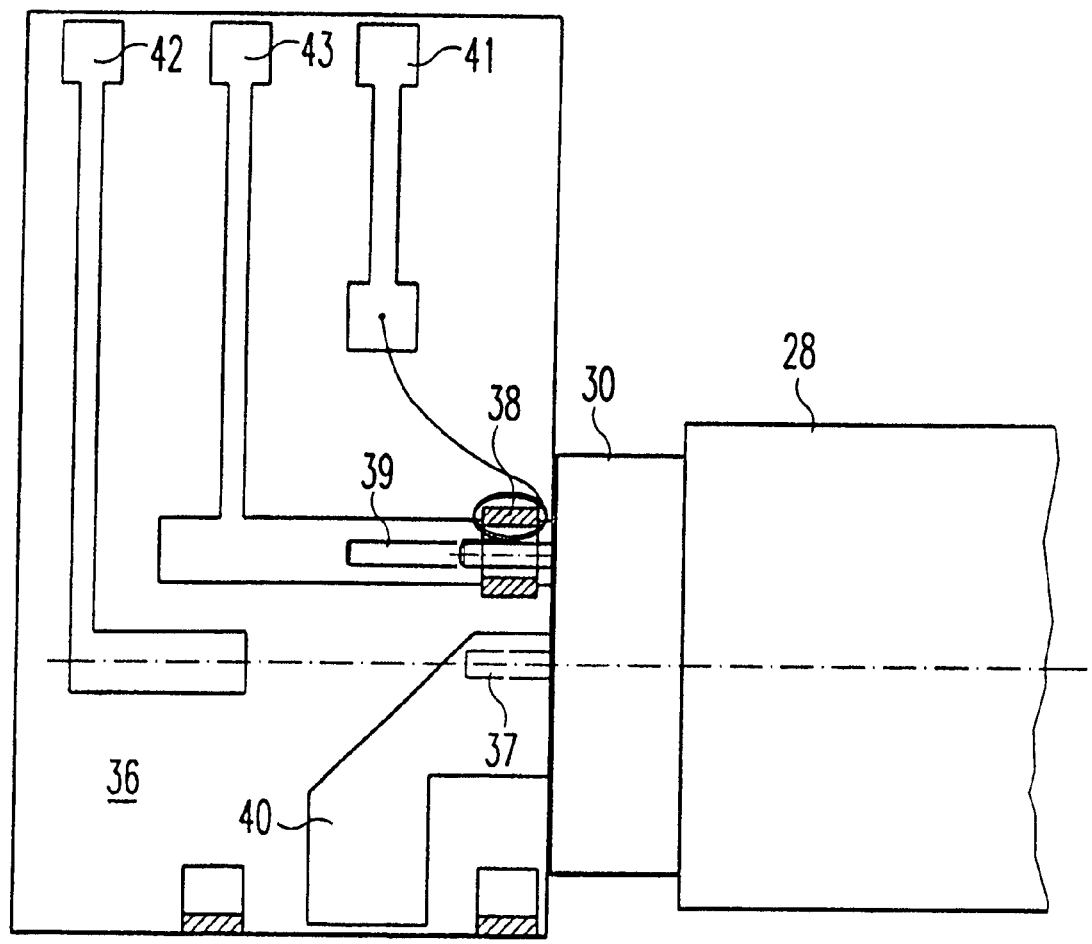
FIG. 8 is a partial, side-elevational view of the optoelectronic component shown in FIGS. 6 and 7.

FIGS. 6, 7 and 8 illustrate a first example of an optoelectronic component which is operated with an RF laser module 29 (according to the invention) as shown in FIGS. 2a to 5b (that is to say either with or without the integrated EAM 114) and in which, furthermore, other measures are taken in order to achieve the highest possible data rate. FIG. 6 shows a plan view of the internal construction of a coaxial case 28 with the laser module 29. The coaxial case 28, which is also called a TO (transistor outline) case, has a base plate 30 with four electrical bushings. The RF signal (data signal) is passed into the case interior via an insulated pin 31 which is, for example, glazed in, and is electrically connected there via short bonding wires or strips 32 to the RF matching resistor $R_A$ or, if a laser chip 11 as shown in FIGS. 4 and 5a, 5b is used with the integrated EAM 114 that is connected to the RF connecting pad 115. The laser module 29 is supplied with the bias current via a further bushing pin 33. The pins 34 and 35 represent still further bushings, and are used to make electrical contact with a monitor chip 6'. The laser module 29 may be positioned in the coaxial case 28 such that the optical axis of a coupling lens 5' coincides with a center axis of the case. Alternatively, any desired off-center optical axis may be used. A board 36, whose position in its section covered by the case 28 is indicated by a dashed line, extends on the rear side of the base plate 30 of the case 28.

FIG. 7 shows a side view of the optoelectronic component from FIG. 6. The board 36 and the coaxial case 28 are mounted on a metal lug 44, which at the same time acts as a ground line. The RF is supplied via that end 37 of the pin 31 which projects out of the base plate 30. Since the board 36 continues as far as a rear wall of the base plate 30 of the case 28 and, furthermore, the end 37 of the RF pin 31 rests directly on the board 36 and is soldered or welded to an RF interconnect there (see FIG. 8), there is no need for any bonding wires and an electrical RF link is provided, which is extremely short overall.

The case 28 may also have a ground pin (in a manner that is not illustrated) which is soldered to a ground side of the board 36. In this case, there is no need for the metal lug 44.

An RF block for the bias-current pin 33 can be achieved in an advantageous manner by a small ferrite coil 38. The ferrite coil 38 contains a ferrite bead which has at least two turns wound on it and is pushed over an end 39 of the bias-current pin 33 that projects at the rear of the case. Alternatively, the bias-current pin 33 may also be connected by as short a distance as possible to an RF inductor located on the board. Even better RF characteristics are achieved if the RF inductor is disposed as close as possible to the laser chip inside the TO case 28. This configuration allows modules with a bandwidth of at least 5 GHz to be achieved. If a conventional optical fiber connection (which is not illustrated in FIG. 7), is used, uncooled coaxial components can be provided for data rates of at least 3 Gbit/s. An optical isolator must be provided between the laser diode and the fiber for high data rates (>1 Gbit/s) over relatively long transmission distances.

FIG. 8 shows a plan view of the configuration illustrated in FIG. 7, with the corresponding connecting interconnects 40, 41 for the RF signal and the bias current, as well as the further interconnects 42, 43 for making contact with the monitor chip 6'.

Figure 9:
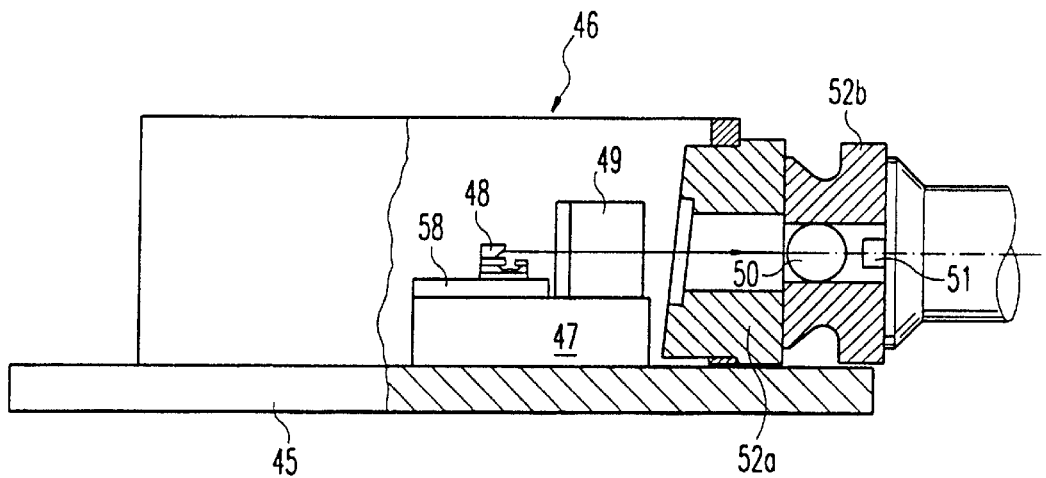
FIG. 9 is a partial sectional view of a second exemplary embodiment of the optoelectronic component having the RF laser module mounted on a cooling element.

FIG. 9 shows a second exemplary embodiment of the optoelectronic component according to the invention. A cooling element 47, for example a Peltier element, is mounted on a base plate 45 of a metal case 46. An intermediate substrate 58 which is generally highly thermally conductive but is electrically insulating and is composed, for example, of BeN or Si is applied to the surface of the cooling element 47, on which intermediate substrate 58 the required metallizations (ground surface for the stripline), contact or bonding pads for the connections, for example, of the monitor chip, of the RF inductor and of a temperature sensor are located, and which forms the base surface for an RF laser module 48. The RF laser module 48 is configured as shown in FIGS. 2a to 5b (that is to say with or without the integrated EAM 114), and differs from the laser module 29 illustrated in FIG. 7 essentially only in that it is equipped with a further 90° deflection prism in a beam path downstream of the coupling lens 5', and thus emits laser light directed parallel to the plane of the substrate (submount).

An optical isolator 49 is disposed in the beam direction behind the RF laser module 48, in order to avoid reactions caused by light being reflected onto the laser. The optical isolator 49 is mounted on the cooling element 47 via a highly thermally conductive joint, as a result of which any influence of the ambient temperature on the optical isolator 49 can be kept negligibly small.

On the outlet side, a fiber coupling is provided on the case, essentially containing a flange piece 52a on the case side and a flange piece 52b which fixes a fiber 51 and has an integrated lens 50.

Figure 10:
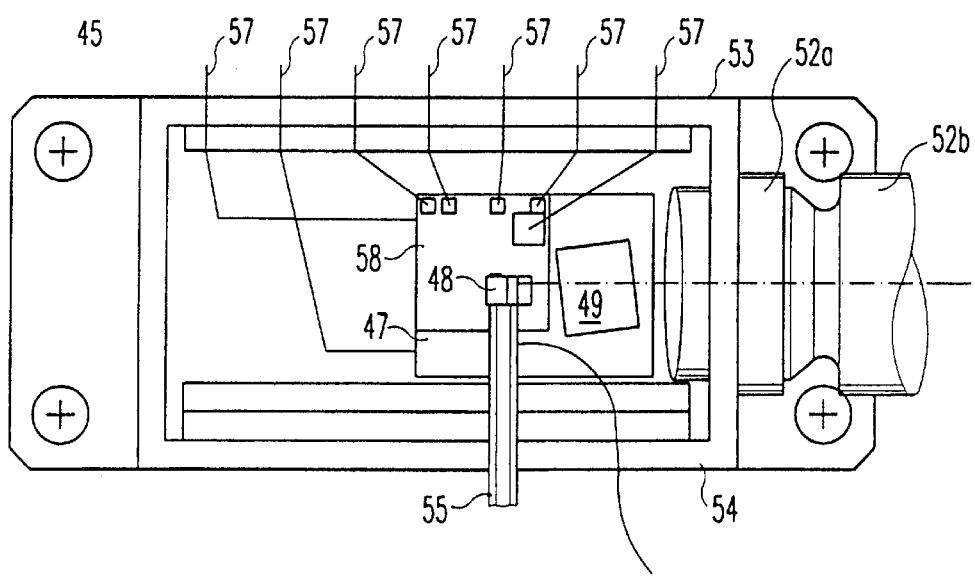
FIG. 10 is a plan view of the optoelectronic component shown in FIG. 9.

FIG. 10 shows a plan view of the component illustrated in FIG. 9. A row of single electrical bushings 57 for the supply and measurement lines of the elements accommodated in the case (for example the Peltier element, monitor chip etc) are provided in the region of one longitudinal side wall 53. An RF bushing 56 is located on an opposite side wall 54, and is configured in the form of a micro-strip conductor 55 passing through the wall or, in a manner which is not illustrated, a coaxial line in the form of a glazed-pin. The connection between the RF bushing 56 and the RF laser module 48 is produced by a stripline or coplanar line, in which case the respective ground lines are connected by welding, soldering or by conductive adhesive, and the signal interconnects are connected by of bonding wires or strips.

A common feature of both exemplary embodiments is that the described measures (which relate to the RF laser module 29, 48, the case 28, 46 with the electrical bushings, and the optical equipment) provide an optical component which is of simple construction, is cost-effective and is suitable for high data rates.

We claim:

1. A radio-frequency laser module, comprising:
    a substrate;
    a semiconductor laser having an RF connection and disposed on said substrate;
    an electrical RF conductive path having a first end and a second end and disposed on said substrate, said first end to receive an external RF driver signal and said second end electrically connected to said RF connection of said semiconductor laser, said electrical RF conductive path also having an RF matching resistor $R_A$ connected in series with said semiconductor laser; and
    an electrical secondary conductive path disposed on said substrate and connected to said RF connection of said semiconductor laser, said electrical secondary conductive path bypassing said RF matching resistor $R_A$ during manufacture of the laser with the substrate being part of a single conductor wafer.

2. The radio-frequency laser module according to claim 1, wherein said RF matching resistor $R_A$ is between 10 and 50 ohms.

3. The radio-frequency laser module according to claim 1, wherein said RF matching resistor $R_A$ is between 20 and 25 ohms.

4. The radio-frequency laser module according to claim 1, including lens coupling optics for defining an emission of a laser light produced by said semiconductor laser.

5. A radio-frequency laser module, comprising:
    a substrate;
    a chip disposed on said substrate and having a semiconductor laser outputting a laser light and an electrical absorption modulator containing an electrical ground contact;
    an RF connecting pad disposed on said substrate;
    a ground contact pad disposed on said substrate and electrically contacting said electrical ground contact of said electrical absorption modulator;
    an RF conductive path disposed on said substrate and electrically connecting said RF connecting pad to said ground contact pad, said RF conductive path having an RF matching resistor $R_A$ connected in parallel with said electrical absorption modulator; and
    an electrical secondary conductive path disposed on said substrate and connected to said ground contact pad, said electrical secondary conductive path bypassing said RF matching resistor $R_A$ during manufacture of the laser with the substrate being part of a single conductor wafer.

6. The radio-frequency laser module according to claim 5, including lens coupling optics for defining an emission of the laser light produced by said semiconductor laser.

7. An optoelectronic component, comprising:
   an RF laser module, including:
     a substrate;
     a semiconductor laser having an RF connection and disposed on said substrate;
     an electrical RF conductive path having a first end and a second end and disposed on said substrate, said first end to receive an external RF driver signal and said second end electrically connected to said RF connection of said semiconductor laser, said electrical RF conductive path also having an RF matching resistor $R_A$ connected in series with said semiconductor laser; and
     an electrical secondary conductive path disposed on said substrate and connected to said RF connection of said semiconductor laser, said electrical secondary conductive path bypassing said RF matching resistor $R_A$ during manufacture of the laser with the substrate being part of a single conductor wafer; and
   a case housing said RF laser module and having an electrical bushing for receiving an RF driver signal and a suitably disposed light outlet window.

8. The optoelectronic component according to claim 7, including a board and an RF interconnect disposed on said board, said case having a case wall and said electrical RF bushing is an electrically insulated pin passing through said case wall and having an end located outside said case, said end of said electrically insulated pin electrically connected directly to said RF interconnect disposed on said board.

9. The optoelectronic component according to claim 8, wherein said electrically insulated pin is soldered to said RF interconnect.

10. The optoelectronic component according to claim 7, wherein said electrical bushing has an electrical connection, disposed inside of said case, connected to said RF laser module, and said electrical bushing forming one of a coaxial line, a stripline and a coplanar line.

11. The optoelectronic component according to claim 7, including an inductance disposed inside of said case and via said inductance a bias current is supplied to said semiconductor laser.

12. The optoelectronic component according to claim 7, including an inductance disposed outside of said case and via said inductance a bias current is supplied to said semiconductor laser.

13. The optoelectronic component according to claim 7, wherein said RF laser module outputs a laser beam having a beam path and including an optical isolator disposed in said beam path of said RF laser module.

14. An optoelectronic component, comprising:
   an RF laser module, including:
     a substrate;
     a chip disposed on said substrate and having a semiconductor laser outputting a laser light and an electrical absorption modulator containing an electrical ground contact;
     an RF connecting pad disposed on said substrate;
     a ground contact pad disposed on said substrate and electrically contacting said electrical ground contact of said electrical absorption modulator;
     an RF conductive path disposed on said substrate and electrically connecting said RF connecting pad to said ground contact pad, said RF conductive path having an RF matching resistor $R_A$ connected in parallel with said electrical absorption modulator; and
     an electrical secondary conductive path disposed on said substrate and connected to said ground contact pad, said electrical secondary conductive path bypassing said RF matching resistor $R_A$ during manufacture of the laser with the substrate being part of a single conductor wafer; and
   a case housing said RF laser module and having an electrical bushing for receiving an RF driver signal and a suitably disposed light outlet window.

* * * * *